(12) United States Patent
Zhan et al.

(10) Patent No.: US 10,002,861 B2
(45) Date of Patent: Jun. 19, 2018

(54) ESD PROTECTION STRUCTURE

(71) Applicant: FREESCALE SEMICONDUCTOR, INC., Austin, TX (US)

(72) Inventors: Rouying Zhan, Chandler, AZ (US); Patrice Besse, Tournefeuille (FR); Changsoo Hong, Phoenix, AZ (US); Jean-Philippe Laine, Saint lys (FR)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/344,131

(22) Filed: Nov. 4, 2016

(65) Prior Publication Data
US 2017/0373053 A1   Dec. 28, 2017

(30) Foreign Application Priority Data

Jun. 23, 2016   (EP) ...................................... 16305762

(51) Int. Cl.
| | | |
|---|---|---|
| *H01L 27/02* | (2006.01) | |
| *H01L 29/74* | (2006.01) | |
| *H01L 29/08* | (2006.01) | |
| *H01L 29/66* | (2006.01) | |
| *H01L 27/12* | (2006.01) | |
| *H01L 29/06* | (2006.01) | |

(52) U.S. Cl.
CPC ...... *H01L 27/0251* (2013.01); *H01L 27/1203* (2013.01); *H01L 29/0649* (2013.01); *H01L 29/0834* (2013.01); *H01L 29/0839* (2013.01); *H01L 29/66393* (2013.01); *H01L 29/7436* (2013.01)

(58) Field of Classification Search
CPC ............. H01L 29/0834; H01L 29/0839; H01L 29/66393; H01L 29/7436; H01L 27/0251
See application file for complete search history.

(56) References Cited

U.S. PATENT DOCUMENTS

| | | | |
|---|---|---|---|
| 5,243,488 A * | 9/1993 | Bernier | H04M 3/18 |
| | | | 361/111 |
| 7,019,338 B1 * | 3/2006 | Ballon | H01L 27/0248 |
| | | | 257/173 |
| 8,242,566 B2 * | 8/2012 | Zhan | H01L 27/0259 |
| | | | 257/106 |
| 8,390,071 B2 * | 3/2013 | Zhan | H01L 27/0259 |
| | | | 257/361 |
| 8,390,092 B2 | 3/2013 | Gendron et al. | |
| 8,647,955 B2 * | 2/2014 | Zhan | H01L 27/0259 |
| | | | 257/361 |
| 8,680,620 B2 | 3/2014 | Salcedo et al. | |
| 8,994,068 B2 | 3/2015 | Zhan et al. | |
| 9,831,233 B2 * | 11/2017 | Salcedo | H01L 27/0262 |
| 2011/0176243 A1 * | 7/2011 | Zhan | H01L 27/0259 |
| | | | 361/56 |

(Continued)

*Primary Examiner* — Victoria K Hall

(57) ABSTRACT

An ESD protection structure formed within a semiconductor substrate of an integrated circuit device. The ESD protection structure comprises a thyristor structure being formed from a first P-doped section forming an anode of the thyristor structure, a first N-doped section forming a collector node of the thyristor structure, a second P-doped section, and a second N-doped section forming a cathode of the thyristor structure. A low-resistance coupling is provided between an upper surface region of the collector node of the thyristor structure and the anode of the thyristor structure.

11 Claims, 4 Drawing Sheets

(56) References Cited

U.S. PATENT DOCUMENTS

| | | | |
|---|---|---|---|
| 2015/0048415 A1* | 2/2015 | Hung | H01L 27/0262 |
| | | | 257/154 |
| 2015/0060941 A1 | 3/2015 | Hwang | |
| 2016/0276332 A1* | 9/2016 | Laine | H01L 27/0251 |
| 2017/0317070 A1* | 11/2017 | Salcedo | H01L 24/49 |

* cited by examiner

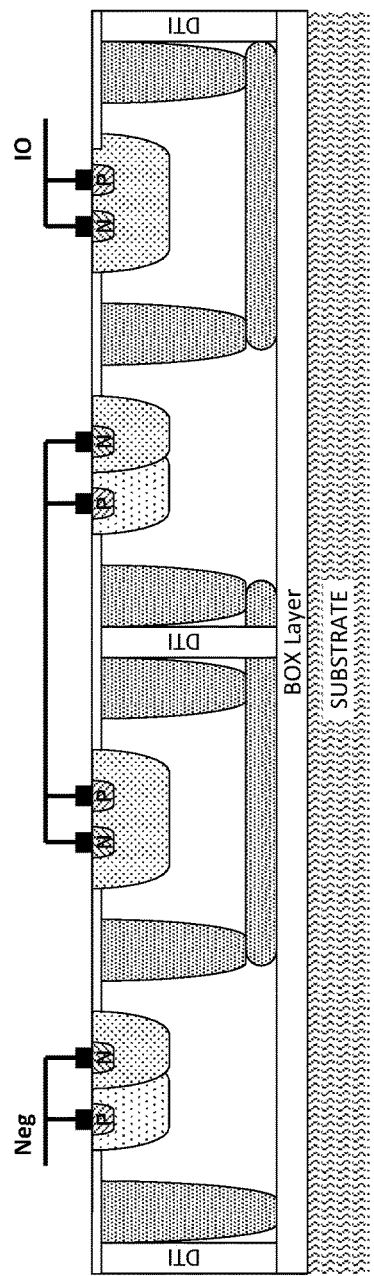
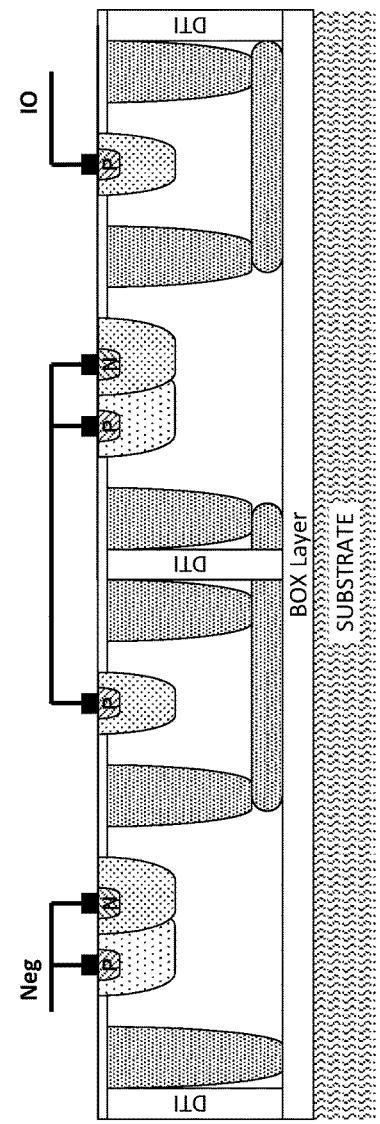

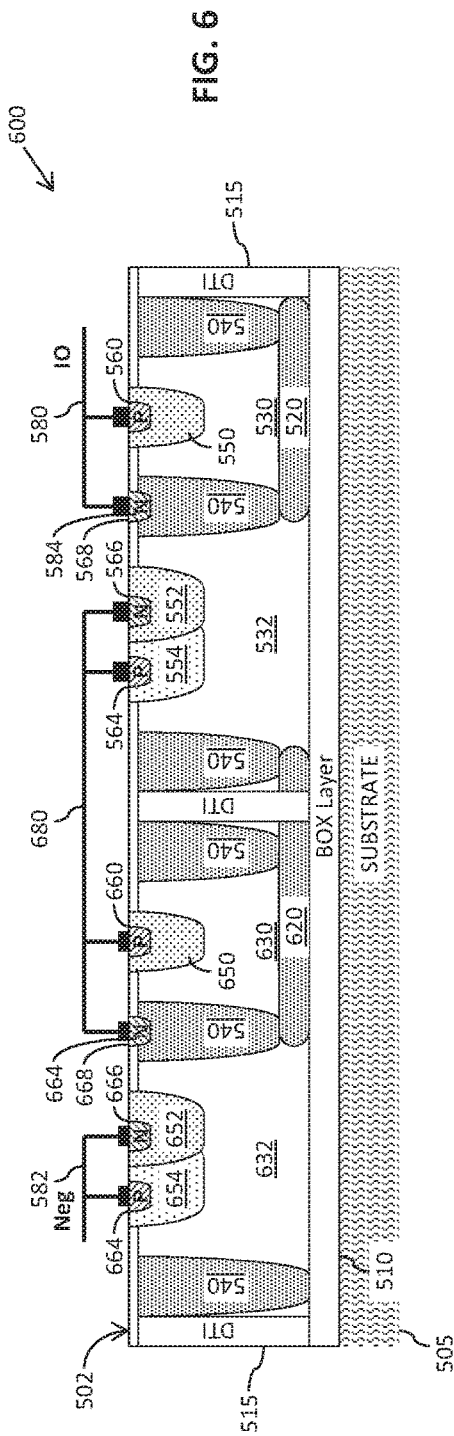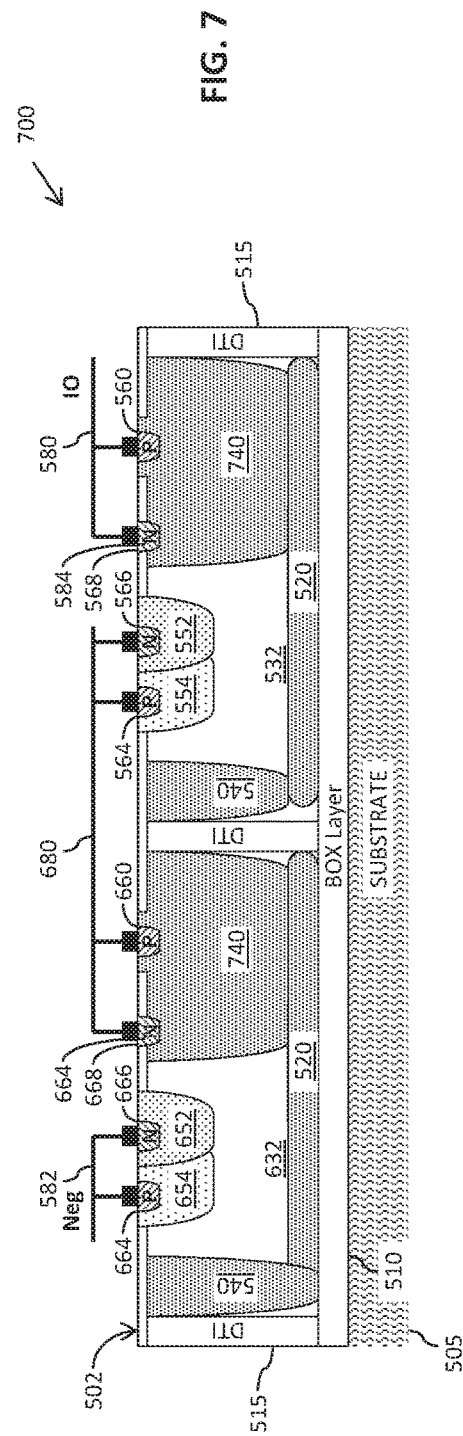

ESD PROTECTION STRUCTURE

FIELD

This invention relates to an electrostatic discharge, ESD, protection structure.

BACKGROUND

Integrated circuit (IC) devices are prone to electrostatic discharge (ESD) events, whereby external contacts of the IC devices are subjected to large electrical charges (positive or negative). Functional circuitry within an IC device is required to be protected from electrical currents created by such large electrical charges at the external contacts of the IC devices, which can cause erroneous behavior within the functional circuitry and even permanently damage the functional circuitry due to the magnitude of the electrical currents that can be generated by ESD events.

To protect the functional circuitry of an IC device from ESD events, it is known to provide susceptible external contacts of the IC device with ESD protection structures. Conventional ESD protection structures typically include thyristor structures (i.e. P-N-P-N semiconductor structures) coupled between an external contact to be protected, such as an input/output (I/O) contact of the IC device, and a power supply contact (e.g. ground or Vss) to which ESD currents are to be shunted.

Many applications require bidirectional ESD protection to be provided for at least some of the external contacts of an IC device. Conventionally, a high voltage bidirectional N-P-N ESD protection structure is used to provide the bidirectional ESD protection. FIG. 1 schematically illustrates a conventional 2-stack bidirectional NPN ESD protection structure formed within a semiconductor substrate.

The footprint of ESD protection structures at the external contacts of IC devices is a significant limiting factor in the minimum die size that can be achieved. To reduce the footprint of the ESD protection structures, an area-efficient version of the conventional bidirectional NPN ESD protection structure illustrated in FIG. 1 was developed. FIG. 2 schematically illustrates such an area-efficient version of the 2-stack bidirectional NPN ESD protection structure of FIG. 1.

A problem with the known area-efficient version of the bidirectional NPN ESD protection structure illustrated in FIG. 2 is that it suffers from a lower holding voltage (Vh) than regular bidirectional NPN ESD protection structure illustrated in FIG. 1, and is thus more susceptible to latch-up conditions.

FIG. 3 illustrates a typical TLP (transmission line pulse) curve of ESD protection structures showing the triggering point (Vt1, It1), first snapback point (Vh and Ih), and second snapback point (Vt2, It2). The current value It2 at the second snapback point defines the current capability of the device before it is thermally damaged by power. The voltage value Vt1 at the triggering point is usually closely correlated to the breakdown voltage for breakdown-triggered devices such as bidirectional NPN devices.

The conventional approach to increasing the holding voltage of a bidirectional NPN ESD protection structure is to enlarge the current path. However, enlarging the current path increases the footprint of the bidirectional NPN ESD protection structure. Accordingly, there is a need for an area-efficient bidirectional NPN ESD protection structure that does not suffer from a reduced holding voltage.

SUMMARY

The present invention provides a electrostatic discharge structure, an integrated circuit device comprising such an electrostatic discharge structure and a method of fabricating such an electrostatic discharge structure as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 schematically illustrates a conventional 2-stack bidirectional NPN ESD protection structure formed within a semiconductor substrate.

FIG. 2 schematically illustrates such an area-efficient version of the 2-stack bidirectional NPN ESD protection structure of FIG. 1.

FIG. 6 schematically illustrates an alternative example of an electrostatic discharge protection structure.

FIG. 7 schematically illustrates a further alternative example of an electrostatic discharge protection structure.

DETAILED DESCRIPTION OF THE PREFERRED EMBODIMENTS

According to some example embodiments of the present invention, an electrostatic discharge (ESD) protection structure is provided consisting of a thyristor structure. As described in greater detail below, a low-resistance coupling is provided between an upper surface region of a collector node of the thyristor structure and an anode of the thyristor structure. In this manner, positive current flowing from the anode of the thyristor structure to the cathode of the thyristor structure will be repelled by a high (positive) voltage potential at the collector node, resulting in a longer current flow path, thereby increasing the holding voltage (Vh) for the ESD protection structure. As a result, an area-efficient ESD protection structure may be achieved without suffering from a reduced high holding voltage (Vh).

Figure 3:
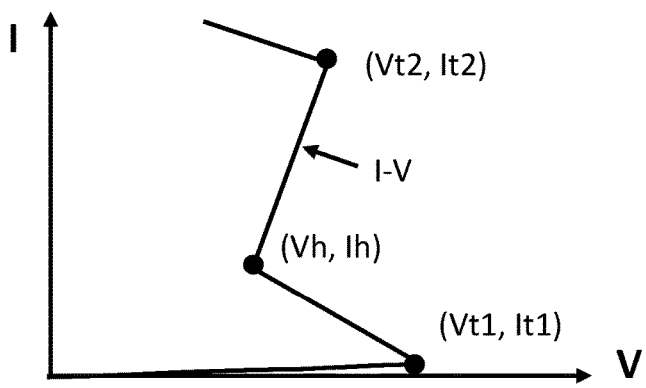
FIG. 3 illustrates a typical TLP (transmission line pulse) curve of ESD protection structures.
Figure 4:
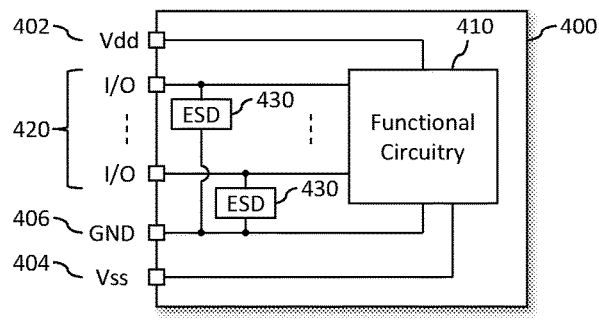
FIG. 4 illustrate a simplified block diagram of an example of an integrated circuit device.

Referring now to FIG. 4, there is illustrated a simplified block diagram of an example of an integrated circuit (IC) device 400. The IC device 400 includes functional circuitry 410 for providing the intended functionality of the IC device 400. Such functional circuitry 410 may include one or more of, for example:

analogue circuits;
combinational logic circuits such as one or more Boolean logic circuits;
sequential logic circuits;
processing cores;
memory elements;
clock generator circuits;
power management units;
interconnect components such as a system bus, crossbar switch or the like;
etc.

The IC device 400 further includes power supply contacts arranged to be coupled to external power supply sources. Three such power supply contacts 402, 404, 406 are illustrated in FIG. 4 for simplicity: one positive voltage power supply contact Vdd 402; one negative voltage power supply contact Vss 404; and one ground supply contact GND 406. However, it will be appreciated that the IC device 400 may include multiple positive or negative voltage power supply contacts 402, 404, as well as multiple ground supply contacts 406. The IC device 400 further includes at least one contact required to be protected from ESD events, such as the input/output (I/O) contacts 420 illustrated in FIG. 4. The IC device 400 further includes at least one ESD protection component 430 coupled between each of the contacts 420 required to be protected from ESD events and at least one of the power supply contacts 402, 404.

Figure 5:
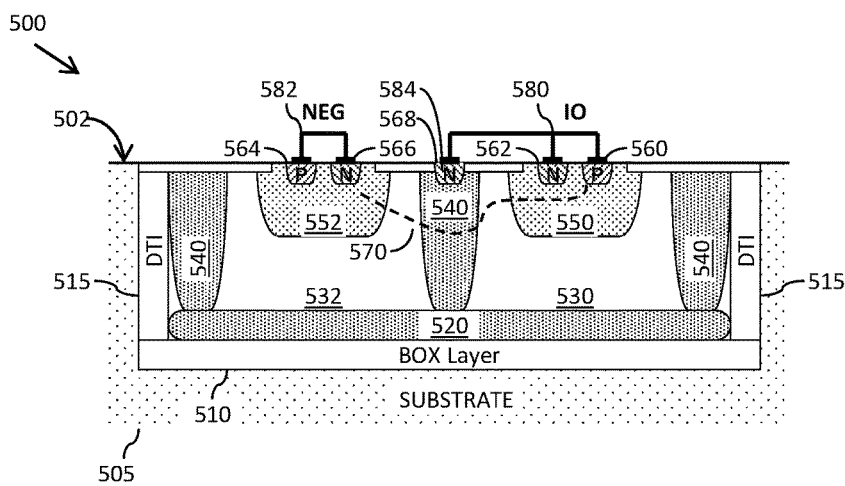
FIG. 5 schematically illustrates an example of an electrostatic discharge protection structure.

FIG. 5 schematically illustrates an electrostatic discharge (ESD) protection structure 500 according to some example embodiments of the present invention formed within a semiconductor substrate 505, such as may be implemented to provide the ESD protection components 430 of the IC device 400 illustrated in FIG. 4. In the example illustrated in FIG. 5, the ESD protection structure 500 is a bidirectional NPN ESD protection structure.

The ESD protection structure 500 illustrated in FIG. 5 is enclosed within an isolation trench, which isolates the ESD protection structure 500 from the substrate 505. The isolation trench is formed by a buried oxide (BOX) layer 510 forming the 'floor' of the isolation trench, and deep trench isolation (DTI) structures 515 forming the 'walls' of the isolation trench.

The ESD protection structure 500 illustrated in FIG. 5 includes a P-doped epitaxial layer divided into two regions 530, 532 by a deep N-well (DPN) structure 540. The DPN structure 540 is further formed such that it laterally encloses each of the two P-doped regions 530, 532.

In the illustrated example the ESD protection structure 500 further includes an N-doped buried layer (NBL) 520, formed to isolate first and second regions 530, 532 of the epitaxial layer from the floor (i.e. the BOX layer 510) of the isolation trench within which the ESD protection structure 500 is contained. As will be appreciated by a person skilled in the art, in some alternative embodiments, the ESD protection structure 500 may alternatively comprise a partial N-doped buried layer whereby only the first region of the epitaxial layer is isolated from the BOX layer 510.

In the example illustrated in FIG. 5, the (silicon) substrate layer 505, (insulator) BOX layer 510 and (silicon) epitaxial/NBLs 520 form a silicon-on-insulator (SOI) layered structure (silicon-insulator-silicon). The BOX layer 510 (and the NBL 520 in the illustrated example) provide vertical (from the cross-sectional perspective illustrated in FIG. 5) isolation between the P-doped regions 530, 532 of the epitaxial layer and the substrate 505. The DPN structure 540 and the DTI structures 515 provide lateral isolation between the individual regions 530, 532 of the epitaxial layer, and between the (P-doped) regions 530, 532 of the epitaxial layer and the (N-doped) substrate 505.

In the example illustrated in FIG. 5, P-doped wells 550, 552 are formed within the two P-doped regions 530, 532 of the epitaxial layer. P-doped contact regions 560, 564 are formed within upper surfaces of the P-doped wells 550, 552. N-doped contact regions 562, 566 are also formed within the upper surfaces of the P-doped wells 550, 552. The use of the term 'upper surface' used herein is intended to refer to a surface of a region or structure (e.g. a P-doped well 550, 552 in this scenario) that is substantially co-planar with a surface 502 of the semiconductor substrate 505 within which the ESD protection structure 500 is formed.

Metalized contact layers are formed over the P-doped contact region 560 and the N-doped contact region 562 within the upper surface of the P-doped well 550 of the first region 530 of the epitaxial layer; said metalized contact layers being arranged to be electrically coupled to a contact 580 of the IC device to be protected, such as an input/output (I/O) contact 420 illustrated in FIG. 4.

Metalized contact layers are formed over the P-doped contact region 564 and the N-doped contact region 566 within the upper surface of the P-doped well 552 of the second region 532 of the epitaxial layer; said metalized contact layers being arranged to be electrically coupled to a negative supply node 582 to which ESD currents are to be shunted, such as the ground supply 406 of the IC device 400 illustrated in FIG. 4.

In some examples, the P-doped wells 550, 552 and the DPN structure 540 may have a higher dopant concentration than the epitaxial layer, whilst the P-doped contact regions 560, 562, 564, 566 may have a still higher dopant concentration than the P-doped wells 550, 552 and the DPN structure 540. Thus, the P-doped contact regions 560, 562, 564, 566 may comprise heavily doped contact regions.

A thyristor (P-N-P-N) structure is formed within the ESD protection structure 500, and is arranged to provide ESD protection during an ESD event, whereby a large charge is injected into the (I/O) contact 580 to be protected. In the example illustrated in FIG. 5, the thyristor structure is formed from:
  a first P-doped section forming an anode of the thyristor structure coupled to the (I/O) contact 580 to be protected, the first P-doped section including the first P-doped well 550 formed within the first P-doped region 530 of the epitaxial layer, and the P-doped contact region 560 within the upper surface of the first P-doped well 550;
  a first N-doped section forming a collector node of the thyristor structure, the first N-doped section including the part of the DPN structure 540 between the first and second P-doped regions 530, 532 of the epitaxial layer and the NBL 520;
  a second P-doped section including the second P-doped well 552 formed within the second P-doped region 532 of the epitaxial layer; and
  a second N-doped section forming a cathode of the thyristor structure coupled to the negative supply node 582 to which ESD currents are to be shunted, the second N-doped section including the N-doped contact region 566 within the upper surface of the second P-doped well 552.

A low-resistance coupling is provided between a surface region of the collector node of the thyristor structure and the anode of the thyristor structure. By providing such a low-resistance coupling, a high voltage potential is created at the surface of the collector node of the thyristor structure (i.e. at the surface of the DPN structure 540 between the first and second P-doped regions 530, 532 of the epitaxial layer). In this manner, 'hole' (positive) current flowing from the anode of the thyristor structure to the cathode of the thyristor structure will be repelled by the high (positive) voltage potential at the collector node, resulting in a longer current flow path as illustrated by the dashed arrow 570, and thus increasing the holding voltage (Vh) for the ESD protection structure.

In the example illustrated in FIG. 5, the low-resistance coupling is created by way of a metalized contact layer 584 formed over an N-doped contact region 568 within the upper surface of the DPN structure 540 between the first and second P-doped regions 530, 532 of the epitaxial layer, and electrically coupling the metalized contact layer 584 to the (I/O) contact 582, and thus to the anode of the thyristor structure.

As noted above the first N-doped section of the thyristor structure includes the part of the DPN structure 540 between the first and second P-doped regions 530, 532 of the epitaxial layer and the NBL 520. In accordance with some example embodiments, the NBL 520 may be located between 2.5 um to 5 um from the surface 502 of the semiconductor substrate 505 within which the ESD protection structure, with a peak doping concentration in the region of approximately 1e19 to 1e21. The DPN structure 540 is formed such that it physically touches and thus electrically connects to the NBL 520.

FIG. 6 schematically illustrates an electrostatic discharge (ESD) protection structure 600 according to some alternative example embodiments of the present invention, formed within a semiconductor substrate 505, such as may be implemented to provide the ESD protection components 430 of the IC device 400 illustrated in FIG. 4. In the example illustrated in FIG. 6, the ESD protection structure 600 is a 2-stack bidirectional NPN ESD protection structure consisting of two sub-structures, each sub-structure being enclosed within an isolation trench formed by a BOX layer 510 and DTI structures 515.

A first sub-structure of the ESD protection structure 600 illustrated in FIG. 6 includes two P-doped epitaxial layer regions 530, 532 separated by a DPN structure 540. The DPN structure 540 is further formed such that it laterally encloses each of the two P-doped regions 530, 532.

In the illustrated example the first sub-structure of the ESD protection structure 600 further includes a partial NBL 520, formed to isolate the first region 530 of the epitaxial layer from the floor (i.e. the BOX layer 510) of the isolation trench within which the first sub-structure of the ESD protection structure 600 is contained. As will be appreciated by a person skilled in the art, in some alternative embodiments, the ESD protection structure 600 may alternatively comprise a full NBL whereby both of the first and second regions 530, 532 of the epitaxial layer are isolated from the BOX layer 510.

In the example illustrated in FIG. 6, P-doped wells 550, 552, 554 are formed within the two P-doped regions 530, 532 of the epitaxial layer. The P-doped well 554 within the second region 532 of the epitaxial layer may include a high-voltage P-doped well (HVPVV) 554 that has low P-dopant concentration in comparison with the other P-doped wells 550, 552. P-doped contact regions 560, 564 are formed within upper surfaces of the P-doped wells 550, 554. An N-doped contact region 566 is also formed within the upper surface of the P-doped well 552. As stated above, the use of the term 'upper surface' used herein is intended to refer to a surface of a region or structure that is substantially co-planar with a surface 502 of the semiconductor substrate 505 within which the ESD protection structure 600 is formed.

A metalized contact layer is formed over the P-doped contact region 560 within the upper surface of the P-doped well 550 of the first region 530 of the epitaxial layer; said metalized contact layer being arranged to be electrically coupled to a contact 580 of the IC device to be protected, such as an input/output (I/O) contact 420 illustrated in FIG. 4.

Metalized contact layers are formed over the P-doped contact region 564 and the N-doped contact region 566 within the upper surfaces of the P-doped wells 552, 554 of the second region 532 of the epitaxial layer.

A first thyristor structure is formed within the first sub-structure of the ESD protection structure 600, the first thyristor structure being formed from:
  a first P-doped section forming an anode of the first thyristor structure coupled to the (I/O) contact 580 to be protected, the first P-doped section including the first P-doped well 550 formed within the first P-doped region 530 of the epitaxial layer, and the P-doped contact region 560 within the upper surface of the first P-doped well 550;
  a first N-doped section forming a collector node of the first thyristor structure, the first N-doped section including the part of the DPN structure 540 between the first and second P-doped regions 530, 532 of the epitaxial layer and the NBL 520;
  a second P-doped section including the second P-doped well 552 formed within the second P-doped region 532 of the epitaxial layer; and
  a second N-doped section forming a cathode of the first thyristor structure coupled to a common node 680, the second N-doped section including the N-doped contact region 566 within the upper surface of the second P-doped well 552.

A first low-resistance coupling is provided between a surface region of the collector node of the first thyristor structure and the anode of the first thyristor structure. In the example illustrated in FIG. 6, the first low-resistance coupling is created by way of a metalized contact layer 584 formed over an N-doped contact region 568 within the upper surface of the DPN structure 540 between the first and second P-doped regions 530, 532 of the epitaxial layer, and electrically coupling the metalized contact layer 584 to the (I/O) contact 580, and thus to the anode of the first thyristor structure.

A second sub-structure of the ESD protection structure 600 illustrated in FIG. 6 includes two further P-doped epitaxial layer regions 630, 632 separated by a DPN structure 540. The DPN structure 540 is further formed such that it laterally encloses each of the two further P-doped regions 630, 632.

In the illustrated example the second sub-structure of the ESD protection structure 600 also includes a partial NBL 620, formed to isolate the first region 630 of the epitaxial layer from the floor (i.e. the BOX layer 510) of the isolation trench within which the second sub-structure of the ESD protection structure 600 is contained. As will be appreciated by a person skilled in the art, in some alternative embodiments, the ESD protection structure 600 may alternatively comprise a full N-doped buried layer whereby both of the first and second regions 630, 632 of the epitaxial layer are isolated from the BOX layer 510.

In the example illustrated in FIG. 6, P-doped wells 650, 652, 654 are formed within the two P-doped regions 630, 632 of the epitaxial layer. The P-doped well 654 within the second region 632 of the epitaxial layer may include a high-voltage P-doped well (HVPW) 654 that has low P-dopant concentration in comparison with the other P-doped wells 650, 652. P-doped contact regions 660, 664 are formed within upper surfaces of the P-doped wells 650, 654. An N-doped contact region 666 is also formed within the upper surface of the P-doped well 652.

A metalized contact layer is formed over the P-doped contact region 660 within the upper surface of the P-doped well 650 of the first region 630 of the epitaxial layer; said metalized contact layer being arranged to be electrically coupled to the common node 680.

Metalized contact layers are formed over the P-doped contact region 664 and the N-doped contact region 666 within the upper surfaces of the P-doped wells 652, 654 of the second region 632 of the epitaxial layer; said metalized contact layers being arranged to be electrically coupled to the negative supply node 582.

A second thyristor structure is formed within the first sub-structure of the ESD protection structure 600, the second thyristor structure being formed from:
- a first P-doped section forming an anode of the second thyristor structure coupled to the common node 680, the first P-doped section including the first P-doped well 650 formed within the first P-doped region 630 of the epitaxial layer, and the P-doped contact region 660 within the upper surface of the first P-doped well 650;
- a first N-doped section forming a collector node of the second thyristor structure, the first N-doped section including the part of the DPN structure 540 between the first and second P-doped regions 630, 632 of the epitaxial layer and the NBL 520;
- a second P-doped section including the second P-doped well 652 formed within the second P-doped region 632 of the epitaxial layer; and
- a second N-doped section forming a cathode of the second thyristor structure coupled to the negative supply node 582, the second N-doped section including the N-doped contact region 666 within the upper surface of the second P-doped well 652.

A second low-resistance coupling is provided between a surface region of the collector node of the second thyristor structure and the anode of the second thyristor structure. In the example illustrated in FIG. 6, the second low-resistance coupling is created by way of a metalized contact layer 664 formed over an N-doped contact region 668 within the upper surface of the DPN structure 540 between the first and second P-doped regions 630, 632 of the epitaxial layer, and electrically coupling the metalized contact layer 664 to the common node 680, and thus to the anode of the second thyristor structure.

Accordingly, for the 2-stack example illustrated in FIG. 6, hole current flowing from the anode to the cathode of each thyristor structure will be repelled by the high (positive) voltage potentials at each of the collector nodes of the first and second thyristor structures, resulting in a longer current flow path, and thus increasing the holding voltage (Vh) for the ESD protection structure 600.

As noted above the first N-doped section of each thyristor structure includes the part of the DPN structure 540 between the respective first and second P-doped regions 530, 532, 630, 632 of the epitaxial layer and the respective NBL 520. In accordance with some example embodiments, each NBL 520 may be located between 2.5 um to 5 um from the surface 502 of the semiconductor substrate 505 within which the ESD protection structure, with a peak doping concentration in the region of approximately 1e19 to 1e21. The DPN structure 540 between the respective first and second P-doped regions 530, 532, 630, 632 of the epitaxial layer is formed such that it physically touches and thus electrically connects to the NBL 520.

FIG. 7 schematically illustrates an electrostatic discharge (ESD) protection structure 700 according to some further alternative example embodiments of the present invention, formed within a semiconductor substrate 505, such as may be implemented to provide the ESD protection components 430 of the IC device 400 illustrated in FIG. 4. In the example illustrated in FIG. 7, the ESD protection structure 700 is a 2-stack bidirectional NPN ESD protection structure consisting of two sub-structures, each sub-structure being enclosed within an isolation trench formed by a BOX layer 510 and DTI structures 515.

A first sub-structure of the ESD protection structure 700 illustrated in FIG. 7 includes a P-doped epitaxial layer region 532. In the example illustrated in FIG. 7, the DPN structure 540 is formed such that it laterally encloses the P-doped region 532 of the epitaxial layer, with an enlarged DPN region 740 formed within an anode side of the epitaxial layer.

In the illustrated example the first sub-structure of the ESD protection structure 700 further includes an NBL 520, formed to isolate the region 532 of the epitaxial layer from the floor (i.e. the BOX layer 510) of the isolation trench within which the first sub-structure of the ESD protection structure 700 is contained. As will become apparent to a person skilled in the art from the description below, in some alternative embodiments the N-doped buried layer may be omitted in the case of an enlarged DPN region 740.

In the example illustrated in FIG. 7, P-doped wells 552, 554 are formed within the P-doped region 532 of the epitaxial layer. The P-doped well 554 may include a high-voltage P-doped well (HVPW) 554 that has low P-dopant concentration in comparison with the other P-doped well 552. P-doped contact regions 560, 564 are formed within upper surfaces of the enlarged DPN region 740 and the P-doped well 554. An N-doped contact region 566 is also formed within the upper surface of the P-doped well 552. As stated above, the use of the term 'upper surface' used herein is intended to refer to a surface of a region or structure that is substantially co-planar with a surface 502 of the semiconductor substrate 505 within which the ESD protection structure 700 is formed.

A metalized contact layer is formed over the P-doped contact region 560 within the upper surface of the enlarged DPN region 740; said metalized contact layer being arranged to be electrically coupled to a contact 580 of the IC device to be protected, such as an input/output (I/O) contact 420 illustrated in FIG. 4.

Metalized contact layers are formed over the P-doped contact region 564 and the N-doped contact region 566 within the upper surfaces of the P-doped wells 552, 554 of the region 532 of the epitaxial layer; said metalized contact layers being arranged to be electrically coupled to a common node 680.

A first thyristor structure is formed within the first sub-structure of the ESD protection structure 700, the first thyristor structure being formed from:
- a first P-doped section forming an anode of the first thyristor structure coupled to the (I/O) contact 580 to be protected, the first P-doped section including the P-doped contact region 560 within the upper surface of the enlarged DPN region 740;

a first N-doped section forming a collector node of the first thyristor structure, the first N-doped section including the enlarged DPN region 740 and the NBL 520;

a second P-doped section including the P-doped well 552 formed within the P-doped region 532 of the epitaxial layer; and a second N-doped section forming a cathode of the first thyristor structure coupled to a common node 680, the second N-doped section including the N-doped contact region 566 within the upper surface of the P-doped well 552.

A first low-resistance coupling is provided between a surface region of the collector node of the first thyristor structure and the anode of the first thyristor structure. In the example illustrated in FIG. 7, the first low-resistance coupling is created by way of a metalized contact layer 584 formed over an N-doped contact region 568 within the upper surface of the enlarged DPN region 740, and electrically coupling the metalized contact layer 584 to the (I/O) contact 580, and thus to the anode of the first thyristor structure.

A second sub-structure of the ESD protection structure 700 illustrated in FIG. 7 includes a P-doped epitaxial layer region 632. In the example illustrated in FIG. 7, the DPN structure 540 is formed such that it laterally encloses the P-doped region 632 of the epitaxial layer, with an enlarged DPN region 740 formed within an anode side of the epitaxial layer.

In the illustrated example the second sub-structure of the ESD protection structure 700 further includes an NBL 520, formed to isolate the region 632 of the epitaxial layer from the floor (i.e. the BOX layer 510) of the isolation trench within which the first sub-structure of the ESD protection structure 700 is contained.

In the example illustrated in FIG. 7, P-doped wells 652, 654 are formed within the P-doped region 632 of the epitaxial layer. The P-doped well 654 may include a high-voltage P-doped well (HVPW) 654 that has low P-dopant concentration in comparison with the other P-doped well 652. P-doped contact regions 660, 664 are formed within upper surfaces of the enlarged DPN region 740 and the P-doped well 654. An N-doped contact region 666 is also formed within the upper surface of the P-doped well 652.

A metalized contact layer is formed over the P-doped contact region 660 within the upper surface of the enlarged DPN region 740; said metalized contact layer being arranged to be electrically coupled to the common node 680.

Metalized contact layers are formed over the P-doped contact region 664 and the N-doped contact region 666 within the upper surfaces of the P-doped wells 652, 654 of the region 632 of the epitaxial layer; said metalized contact layers being arranged to be electrically coupled to the negative supply node 582.

A second thyristor structure is formed within the second sub-structure of the ESD protection structure 700, the second thyristor structure being formed from:

a first P-doped section forming an anode of the second thyristor structure coupled to the common node 680, the first P-doped section including the P-doped contact region 660 within the upper surface of the enlarged DPN region 740;

a first N-doped section forming a collector node of the second thyristor structure, the first N-doped section including the enlarged DPN region 740 and NBL 520;

a second P-doped section including the P-doped well 652 formed within the P-doped region 632 of the epitaxial layer; and a second N-doped section forming a cathode of the second thyristor structure coupled to negative supply node 582, the second N-doped section including the N-doped contact region 666 within the upper surface of the P-doped well 652.

A first low-resistance coupling is provided between a surface region of the collector node of the second thyristor structure and the anode of the second thyristor structure. In the example illustrated in FIG. 7, the first low-resistance coupling is created by way of a metalized contact layer 664 formed over an N-doped contact region 668 within the upper surface of the enlarged DPN region 740, and electrically coupling the metalized contact layer 664 to the common node 680, and thus to the anode of the second thyristor structure.

For the example embodiment illustrated in FIG. 7, by forming such an enlarged DPN region 740 within the epitaxial layer, whereby the regions 530, 630 for the example illustrated in FIG. 6 are effectively 'filled in' and the respective P-doped wells 550, 650 removed, the high (positive) voltage potentials created at each of the collector nodes of the first and second thyristor structures become more uniform, thereby further improving the holding voltage (Vh) for the ESD protection structure 700, as well as enabling the footprint for the ESD protection structure 700 to be further reduced.

As noted above the first N-doped section of each thyristor structure includes the part of the enlarged DPN region 740 and the NBL 520. In accordance with some example embodiments, each NBL 520 may be located between 2.5 um to 5 um from the surface 502 of the semiconductor substrate 505, with a peak doping concentration in the region of approximately 1e19 to 1e21. The enlarged DPN region 740 is formed such that it physically touches and thus electrically connects to the NBL 520.

Figure 8:
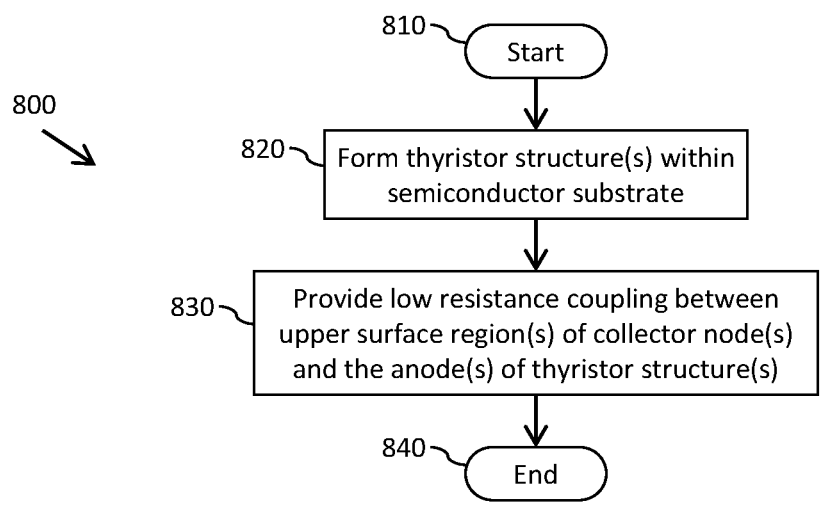
FIG. 8 illustrates a simplified flowchart of an example of a method of fabricating an ESD protection structure within a semiconductor substrate of an integrated circuit device.

Referring now to FIG. 8, there is illustrated a simplified flowchart 800 of an example of a method of fabricating an ESD protection structure within a semiconductor substrate of an integrated circuit device, such the ESD protection structures 500, 600, 700 illustrated in FIGS. 5 to 7. The simplified flowchart starts at 810 and moves on to 820 where one or more thyristor structures are formed within the semiconductor substrate. A low-resistance coupling is then provided for the, or each, thyristor structure between an upper surface region of a collector node for the respective thyristor and an anode of the respective thyristor, 830. The simplified flowchart 800 of the method then ends at 840.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. For example, the present invention is not limited to being implemented within SOI (silicon-on-insulator) ESD structures, or within ESD structures enclosed within deep trench isolation (DTI) structures.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The semiconductor substrate described herein can be any semiconductor material or combinations of materials, such as gallium arsenide, silicon germanium, silicon-on-insulator (SOI), silicon, monocrystalline silicon, the like, and combinations of the above.

Although specific conductivity types or polarity of potentials have been described in the examples, it will be appreciated that conductivity types and polarities of potentials may be reversed.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claim is:

1. An electrostatic discharge, ESD, protection structure formed within a semiconductor substrate of an integrated circuit device, the ESD protection structure comprising:
   a first thyristor structure being formed from
      a first P-doped section forming an anode of the first thyristor structure,
      a second P-doped section,
      a first N-doped section forming a collector node of the first thyristor structure, wherein the first N-doped section is located between the first and second P-doped sections,
      a second N-doped section forming a cathode of the first thyristor structure, wherein the second N-doped section is located in the second P-doped section; and
   a first low-resistance coupling between an upper surface region of the collector node of the first thyristor structure and the anode of the first thyristor structure.

2. The ESD protection structure of claim 1, wherein the first low-resistance coupling comprises a metalized layer formed over an N-doped contact region within the upper surface region of the collector node of the first thyristor structure, and the metalized layer is coupled to the anode of the first thyristor structure.

3. The ESD protection structure of claim 1, wherein the first N-doped section of the first thyristor structure comprises a deep N-well structure and an N-doped buried layer.

4. The ESD protection structure of claim 1, wherein the first P-doped section forming the anode of the first thyristor structure is coupled to a contact of the integrated circuit device to be protected.

5. The ESD protection structure of claim 1, wherein the second N-doped section forming the cathode of the first thyristor structure is coupled to a negative supply node to which ESD currents are to be shunted.

6. The ESD protection structure of claim 1, wherein:
   the first P-doped section forming the anode of the first thyristor structure comprises a first P-doped well formed within a first P-doped region of an epitaxial layer, and a P-doped contact region within an upper surface of the first P-doped well;
   the second P-doped section comprises a second P-doped well formed within a second P-doped region of the epitaxial layer;
   the first N-doped section forming the collector node of the first thyristor structure comprises a part of a deep N-well structure between the first and second P-doped regions of the epitaxial layer; and
   the second N-doped section forming the cathode of the first thyristor structure comprises an N-doped contact region within an upper surface of the second P-doped well.

7. The ESD protection structure of claim 1, wherein:
   the first P-doped section forming the anode of the first thyristor structure comprises a first P-doped contact region within an upper surface of enlarged deep N-well (DPN) region;
   the first N-doped section forming a collector node of the first thyristor structure comprises the enlarged DPN region;
   the second P-doped section comprises a second P-doped well formed within a P-doped region of an epitaxial layer; and
   the second N-doped section forming the cathode of the first thyristor structure comprises an N-doped contact region within an upper surface of the second P-doped well.

8. The ESD protection structure of claim 1 comprising the first thyristor structure and a second thyristor structure; wherein:
   a second low-resistance coupling is provided between an upper surface region of a collector node of the second thyristor structure and an anode of the second thyristor structure.

9. The ESD protection structure of claim 8, wherein:
   the first P-doped section forming the anode of the first thyristor structure is coupled to a contact of the integrated circuit device to be protected;
   an N-doped section forming a cathode of the second thyristor structure is coupled to a negative supply node to which ESD currents are to be shunted; and
   the second N-doped section forming the cathode of the first thyristor structure and a P-doped section forming an anode of the second thyristor structure are coupled to a common node.

10. An integrated circuit device comprising at least one semiconductor substrate comprising at least one electrostatic discharge, ESD, protection structure according to claim 1.

11. A method of fabricating an electrostatic discharge, ESD, protection structure within a semiconductor substrate of an integrated circuit device; the method comprising:
   forming a thyristor structure within the semiconductor substrate, the thyristor structure being formed from:
   a first P-doped section forming an anode of the thyristor structure,
   a second P-doped section,
   a first N-doped section forming a collector node of the thyristor structure, wherein the first N-doped section is formed between the first and second P-doped sections, a second N-doped section forming a cathode of the thyristor structure, wherein the second N-doped section is formed in the second P-doped section; and providing a low-resistance coupling between an upper surface region of the collector node of the thyristor structure and the anode of the thyristor structure.

* * * * *